United States Patent [19]

De Wolf

[11] Patent Number: 4,918,650

[45] Date of Patent: Apr. 17, 1990

[54] MEMORY CONTROL INTERFACE APPARATUS

[75] Inventor: Nicholas De Wolf, Aspen, Colo.

[73] Assignee: ON! Systems, Libertyville, Ill.

[21] Appl. No.: 944,563

[22] Filed: Dec. 22, 1986

[51] Int. Cl.[4] .......................... G06F 12/16; G11C 7/00
[52] U.S. Cl. ............................... 364/900; 364/927.92; 364/964.9; 365/222
[58] Field of Search ................ 365/222; 364/200, 900, 364/200 MS File, 900 MS File

[56] References Cited

U.S. PATENT DOCUMENTS

| | | | |
|---|---|---|---|
| 3,748,651 | 7/1973 | Mesnik | 365/222 |
| 4,142,233 | 2/1979 | Suzuki | 364/200 |
| 4,218,753 | 8/1980 | Hendrie | 364/900 |
| 4,249,247 | 2/1981 | Patel | 364/200 |
| 4,509,115 | 4/1985 | Manton et al. | 364/200 |
| 4,542,454 | 9/1985 | Brcich et al. | 364/200 |
| 4,625,296 | 11/1986 | Shriver | 364/900 |
| 4,631,701 | 12/1986 | Kappeler et al. | 364/900 |
| 4,649,511 | 3/1987 | Gdula | 364/900 |
| 4,700,330 | 10/1987 | Altman et al. | 364/900 X |

*Primary Examiner*—Eddie P. Chan
*Assistant Examiner*—Paul Kulik

*Attorney, Agent, or Firm*—Mason, Kolehmainen, Rathburn & Wyss

[57] ABSTRACT

A memory control interface is provided for use with at least one external memory device used in conjunction with a microprocessor based system of the type providing address, control and data signals and having a basic input/output operating system for providing predefined instructions. The memory control interface apparatus receives the address, control and data signals from the microprocessor based system. Decoder circuitry decodes the received signals to identify predetermined signals corresponding to the predefined instructions. Timing circuitry responsive to the identified predetermined signals produces timing signals. Enabling circuitry responsive to both the identified predetermined signals and the timing signals generates an enable signal for coupling the microprocessor based system and the external memory; only after reliable operation of the microprocessor based system is identified. The memory control interface apparatus further includes refreshing circuitry that enables refreshing of the external memory independently of the microprocessor based system whereby power requirements of the external memory are optimized, and the microprocessor system is relieved of the memory refreshing task.

3 Claims, 2 Drawing Sheets

MEMORY CONTROL INTERFACE APPARATUS

BACKGROUND OF THE INVENTION

1. Field of the Invention

The present invention relates generally to data processing systems, and more particularly to a memory control interface apparatus for use with an external memory device in conjunction with a single-chip microprocessor or a microprocessor based system.

2. Description of the Prior Art

Known microprocessor systems rely on the proper operation of the microprocessor for data transfer to and from an external memory. Typically, a single microprocessor command is employed for enabling an external memory. As a result of microprocessor errors, invalid data can be transferred to the memory so the integrity of the stored data is destroyed.

External memories in the form of dynamic semiconductor memory cells such as dynamic random access memories (RAM) must be refreshed or replenished to periodically place an additional charge on all the memory cells that are at a logic 1 level. In known microprocessor systems, the dynamic RAM is usually refreshed with each read operation of the memory performed by the microprocessor. When the dynamic RAM is not being read to transfer data to the microprocessor, a required processing task of the microprocessor is sequentially reading through the memory to refresh memory at a determined time interval. Such refreshing arrangement adds to the processing overhead and results in inefficiency in the microprocessor system. In addition, the resulting refreshing rate of such arrangements is higher than necessary for maintaining reliable memory operation and as a result increases the power requirements for the dynamic RAM.

SUMMARY OF THE INVENTION

Among the important objects of the present invention are to provide a new and improved memory control interface apparatus for use with at least one external memory device used with a microprocessor based system; to provide such memory control apparatus enabling effective, efficient and reliable data transfers between the microprocessor system and the external memory device; and to provide such memory control interface apparatus enabling refreshing of the external memory independently of the microprocessor based system whereby power requirements of the external memory are optimized, and the microprocessor system is isolated from the memory refreshing task.

In brief, in accordance with the above and other objects of the present invention, there is provided a memory control interface method and apparatus for use with at least one external memory device used in conjunction with a microprocessor based system of the type providing address, control and data signals and having a basic input/output operating system for providing predefined instructions. The memory control interface apparatus receives the address, control and data signals from the microprocessor based system. Decoder circuitry decodes the received signals to identify predetermined signals corresponding to the predefined instructions. Timing circuitry responsive to the identified predetermined signals produces timing signals. The timing signals are used to determine that the microprocessor has provided the predefined instructions within a selected time period. Enabling circuitry responsive to both the identified predetermined signals and the timing signals generates an enable signal for coupling the microprocessor based system and the external memory; only after reliable operation of the microprocessor system is identified. The memory control interface apparatus further includes refreshing circuitry responsive to the enable signal for identifying a predetermined number of data request signals and for refreshing the external memory in response to the identified predetermined number of data request signals. The refreshing circuitry refreshes the memory at an independent asynchronous predetermined rate in response to a disable signal that is generated after an elapsed time interval without data following both transfers and after a predetermined number of data transfers.

BRIEF DESCRIPTION OF THE DRAWING

The present invention together with the above and other objects and advantages may be best understood from the following detailed description of the preferred embodiment of the invention illustrated in the drawings, wherein.

DETAILED DESCRIPTION OF THE PREFERRED EMBODIMENT

Figures 1, 2A:
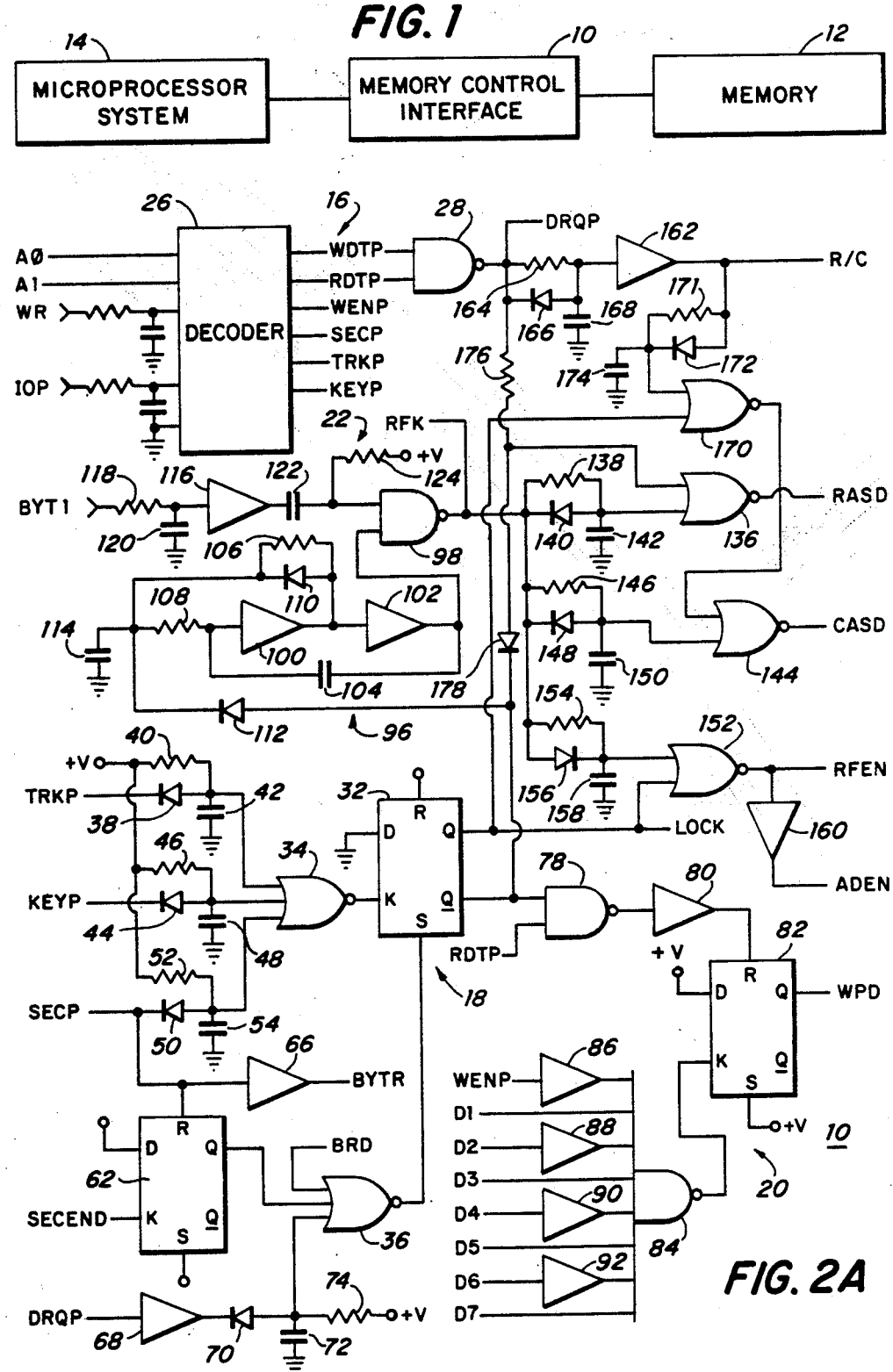
FIG. 1 is a block diagram representation of a memory control interface apparatus in accordance with the principles of the present invention.
FIGS. 2A and 2B provide a schematic representation of the memory control interface of FIG. 1.

Referring initially to FIG. 1, there is shown a block diagram representation of a memory control interface apparatus 10 arranged in accordance with the principles of the present invention for use with an external memory device 12 used in conjunction with a microprocessor system 14. Although the memory control interface apparatus 10 advantageously can be used with a variety of different types of external memory devices, the apparatus 10 is described herein for use with at least one dynamic random access memory (DRAM) 12 that must be refreshed and that includes address inputs A0–A8, a write enable (WE) input, a row address strobe (RAS) input, a column address strobe (CAS) input and a bidirectional data input/output (D1–D7), all shown in FIG. 2B. The microprocessor system 14 includes a microprocessor such as, for example, an 8-bit data, 16-bit address microprocessor, such as a Zilog Z80 microprocessor, although a variety of commercially available microprocessors having standard capabilities could be used. The microprocessor system 14 provides address, control and data signals and includes a basic input/output operating system (BIOS) for providing a predefined sequence of instructions.

Figure 2B:
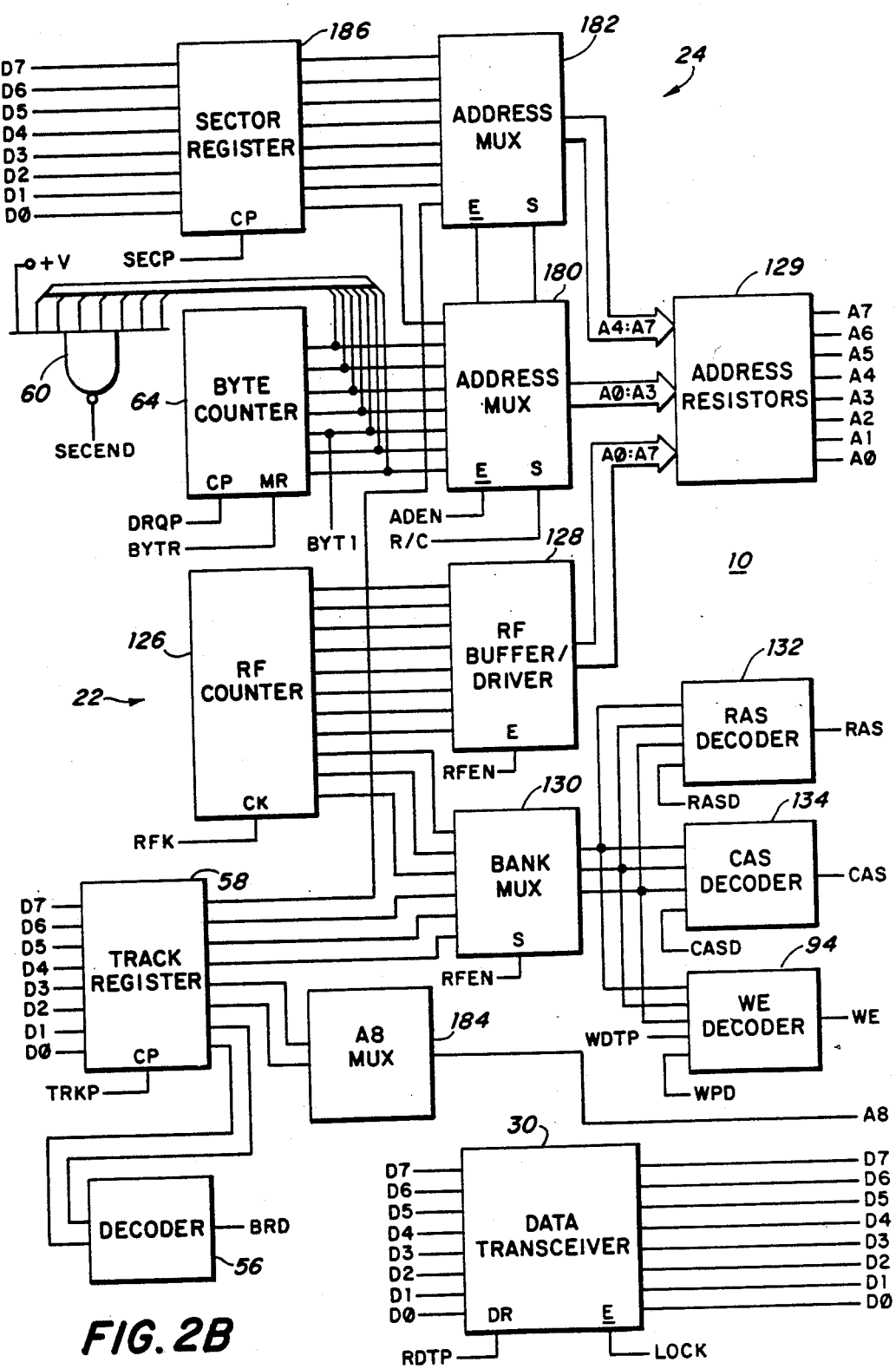

Referring now to FIGS. 2A and 2B, there is shown a schematic representation of the memory control interface apparatus 10. Inverted logic outputs are shown and described herein with underlining, such as the inverted Q or Q-bar output being shown as Q. As its major functional components, the memory control interface apparatus 10 includes decoder circuitry 16 for receiving and decoding address and control signals from the microprocessor system 14, a locking circuit 18 for selectively isolating and coupling the memory 12 to the microprocessor system 14, a write protecting circuit 20 for enabling data to be written by the microprocessor system 14 to the memory 12, a refreshing circuit 22 for refreshing the external memory 12, and an addressing circuit 24 for providing address and timing address strobe signals to the external memory 12. Examples of commercially available integrated circuit devices including complementary metal oxide semiconductor CMOS and low-power Schottky transistor-transistor logic LSTTL device types, such as those sold by Motorola, Inc. are given as examples herein for various component of the memory control interface apparatus 10, although the apparatus 10 can be otherwise implemented including by way of a customized integrated circuit device.

The BIOS of the computer system 14 sequentially provides an instruction or command sequence to the memory control interface apparatus 10 in order to read from or write to the external DRAM 12. A one-of-eight decoder device 26 receives and decodes microprocessor address signals (address bits A0, A1) and microprocessor control signals (WR and IOP). An integrated circuit one-of-eight decoder such as, for example, an LSTTL/74LS138 including three enable inputs and three binary weighted inputs for providing eight mutually exclusive active LOW outputs may be used for the decoder 26. Six exclusive LOW outputs corresponding to the binary weighted inputs at lines A0, A1 and WR with the microprocessor control IOP signal LOW, are generated by the decoder 26. These resulting outputs at lines WDTP, RDTP, WENP, SECP, TRKP, and KEYP of the decoder 26 correspond to predefined microprocessor instructions including write data, read data, write enable, set sector, set track, and key, respectively. The write data (WDTP) output and a read data (RDTP) output of the decoder 26 are applied to a NAND gate 28 for generating an active HIGH data request signal output of NAND 28 at line labelled DRQP that is applied to the locking circuitry 18 and the refreshing circuitry 22. The outputs of decoder 26 are utilized for controlling the locking circuitry 18, the write protecting circuitry 20, the refreshing circuitry 22 and the addressing circuitry 24 as is now described.

Locking circuitry 18 identifies predefined instructions; or alternatively, a predetermined sequence of predefined instructions, that must be provided by the microprocessor system 14 within a predetermined time period to cause the locking circuitry 18 to provide an active LOW enable signal to a data transceiver 30 (FIG. 2B) for coupling data lines D0:D7 between the microprocessor 14 and the external memory 12. An octal bus transmitter/receiver integrated circuit device type LSTTL/74LS245 can be used for the data transceiver 30. A HIGH signal applied by the locking circuitry 18 to the enable E input of transceiver 30 isolates the microprocessor system 14 and the memory 12. The read data (RDTP) output of decoder 26 is applied to a direction DR input of the data transceiver 30 for selecting the direction of transferred data from the microprocessor system 14 to the memory 12 or from the memory 12 to the microprocessor 14. A HIGH signal applied to the DR input of the transceiver 30 enables a data transfer from the microprocessor system 14 to the memory 12 and conversely a LOW signal applied to the DR input enables a data transfer from the memory 12 to the microprocessor system 14.

Locking circuitry 18 includes a D-type positive edge triggered flip-flop F/F 32 having a Q output at a line labeled LOCK providing the control enable signal for the data transceiver 30. An output of a three input NOR gate 34 is applied to clock the F/F 32. A second three-input NOR gate 36 provides an output that is applied to the set S input of the F/F 32 with the D input tied to ground potential and the clear or reset R input connected to a positive voltage supply +V. The set track (TRKP) output of the decoder 26 is applied to a first input of NOR gate 34 via a pulse width extender combination of a diode 38 with a resistor 40 and a capacitor 42 connected in series between a positive voltage supply +V and ground potential and at their junction to the anode of the diode 38 to provide a determined RC time constant according to their component values. The key (KEYP) output of the decoder 26 is applied to a second input of the NOR gate 34 via a similarly arranged pulse width extender combination of a diode 44, a resistor 46 and a capacitor 48. The set sector (SECP) output of decoder 26 is applied to the third input of NOR gate 34 via a similarly arranged pulse width extender combination of a diode 50, a resistor 52 and a capacitor 54. The outputs of decoder 26 are normally HIGH resulting in a LOW output of NAND gate 34 being applied to the clock input of F/F 32. A HIGH output of the NAND gate 34 results from the three pulse width extended input being simultaneously LOW.

Substantially equal RC time constants can be provided for each of the signal inputs to NOR gate 34, to determine the time interval within which the microprocessor must provide the predefined set track, key and set sector instructions. Alternatively, the RC time constants for each of the inputs to NOR gate 34 can be separately selected so that these instructions must be provided in a predefined sequence for the resulting simultaneously LOW inputs to NOR gate 34.

An output signal at line BRD of a decoder 56 (FIG. 2B) is applied to a first input of NOR gate 36. The decoder 56 receives selected output bits from a track store eight-bit register 58, such as an integrated circuit device type 74LS273 high speed 8-bit register with an active HIGH going edge clock input. Register 58 is clocked by the set track (TRKP) output of the decoder 26 to provide data outputs corresponding to the data inputs. Track store register 58 receives the data signals D1–D7 provided by the microprocessor system 14 with the predetermined set track instruction and provides selected data output bits, such as outputs Q3–Q4 to binary weighted inputs of the decoder 56. A similar one-of-eight decoder device as used for the decoder 26 can be utilized for decoder 56. Decoder 56 is configured to provide an active LOW output signal BRD responsive to the predetermined input bits received from the register 58.

An output at a line labelled SECEND of an octal-input NAND gate 60 (FIG. 2B) is applied to a second input of the NOR gate 36 via a D-type positive edge triggered flip-flop F/F 62. The output (SECEND) signal of NAND gate 60 is LOW following a predetermined number of transferred data bytes between the microprocessor system 14 and the memory 12. A byte counter 64 such as a dual four stage binary counter integrated circuit device type 74LS393 configured for counting up to 127, provides seven binary coded output lines that are applied to the octal input NAND gate 60. The set sector (SECP) output of decoder 26 is applied to both a reset input of F/F 62 and an inverter 66 to provide an inverted output at a line labelled BYTR. This (BYTR) output signal is applied to a master reset MR input of the byte counter 64. The data request (DRQP) signal output of NAND gate 28 is applied to a clock input of the byte counter 64 so that after 127 bytes of data have been transferred, the eight outputs of the byte counter 64 are HIGH resulting in a LOW (SECEND) output of NAND gate 60. A HIGH (SECEND) output of the NAND gate 60 results from a next data request (DRQP) applied to the counter 64 or from the counter 64 being reset by an active HIGH input at line BYTR. This LOW to HIGH transition clocks the D-type flip-flop 62 resulting in a HIGH Q output applied to the second input of the NOR gate 36. The responsive LOW output of NOR gate 36 sets the Q output of F/F 32 HIGH, so that the memory 12 is isolated from the microprocessor 14.

The data request (DRQP) output of NAND gate 28 is applied to an inverter 68 to produce an active LOW signal. This active LOW signal is applied to the third input of NOR gate 36 via a diode 70, and a series combination of a capacitor 72 and a resistor 74 configured as described before as a pulse width extender. The component values of resistor 74 and capacitor 72 establish a time-out interval effective to set the Q output of F/F 32 HIGH when a next data request (DRQP) signal is not received within this determined time interval. This is provided by the HIGH input to NOR gate 36 providing a LOW output of NOR gate 36 that is applied to the set S input of F/F 32, thus resulting in the HIGH Q output of F/F 32.

In summary, with a HIGH input signal applied to the set S and clock K inputs of the flip-flop 32 a resulting LOW Q output of F/F 32 at line LOCK is applied to the data transceiver 30 to enable a data transfer between the microprocessor system 14 and the memory 12. A HIGH Q (LOCK) signal output of the F/F 32 effective for isolating the external memory 12 from the microprocessor system 14 results from a LOW output of NOR gate 36 applied to the set S input of F/F 32.

Write protecting circuitry 20 provides an active HIGH write enable decoder signal output at line WPD for enabling data to be written to the memory 12 responsive to the LOW Q (LOCK) signal output of F/F 32 of locking circuitry 18 and predefined instructions provided by the microprocessor 14. The inverted Q output shown as Q of the F/F 32 is applied to a first input of a NAND gate 78 of the write protecting circuitry 20. The read data (RDTP) output of decoder 26 is applied to the second input of NAND gate 78. The output of NAND gate 78 is applied to an inverter 80 to provide a reset input to a D-type positive edge triggered flip-flop F/F 82. The F/F 82 is configured with the D input the set S input connected to the positive voltage supply +V to provide a resulting HIGH Q output signal at line WPD with a HIGH signal applied to both the reset (R) input and clock input.

An output of an octal-input NAND gate 84 is applied to the clock input of the F/F 82. A write enable output at line WENP of the decoder 26 is coupled through an interver 86 to apply a corresponding active HIGH signal to a first input of the NAND gate 84. Data lines D1, D3, D5 and D7 from the microprocessor system 14 are applied to four inputs of the NAND gate 84. Data lines D2, D4 and D6 are applied via an inverter 88, 90 and 92, respectively, to the remaining three inputs of NAND gate 84. NAND gate 84 provides a LOW to HIGH transition signal to clock the F/F 82 responsive to predefined data inputs D1-D7 (0101010) with the predetermined instruction address bits A0 and A1 and write WR signal applied to the decoder 26 resulting in the exclusive LOW write enable (WENP) output of decoder 26. The Q output of F/F 82 shown at the line WPD is applied to an active HIGH enable input of a write enable decoder 94 (FIG. 2B). The write enable decoder 94 may be of the identical integrated circuit type as employed for the decoder 26. A write enable output at line WE of the write enable decoder 94 is applied to the external memory 12 for enabling the memory 12 to receive data from the microprocessor system 14 responsive to a HIGH Q (WPD) signal output of F/F 82.

The refreshing circuitry 22 provides a refreshing clock signal at a line RFK for refreshing the external memory 12. The refreshing clock (RFK) signal is provided at a first predetermined rate when the memory 12 is idle and isolated from the microprocessor system 14. This first predetermined refresh clock rate is provided at a minimum necessary rate for maintaining reliable stored data in the idle memory 12 in order to minimize power requirements of the memory 12. Alternately, the refreshing clock (RFK) signal is provided at a second predetermined rate when the memory 12 is being read or written to by the microprocessor system 14. This second predetermined rate corresponds to a predetermined number of data transfers between the microprocessor system 14 and the memory 12 likewise for minimizing the refresh clock rate while maintaining reliable stored data in the active memory 12 in order to minimize power requirements of the memory 12.

An oscillator circuit designated by the reference numeral 96 provides the refresh clock (RFK) signal output of a NAND gate 98 at the first predetermined rate when the memory 12 is idle. When the memory is isolated from the microprocessor system 14, operation of the oscillator 96 is enabled by a LOW Q of F/F 32 of the locking circuitry 18. Oscillator 96 includes a pair of series-connected inverters 100 and 102 connected in parallel with a capacitor 104 and series-connected feedback resistors 106 and 108 coupled between the junction of inverters 100 and 102 and the input of inverter 100. A diode 110 is connected in parallel with the feedback resistor 106. The Q output of the F/F 32 is coupled at the junction of series-connected resistors 106 and 108 via a diode 112 with a capacitor 114 connected between this junction and ground. The inverter oscillator 96 is disabled by a HIGH Q output of F/F 22 resulting when the memory 12 is coupled to the microprocessor system 14 by the functional operation of the locking circuit 18.

The refresh clock (RFK) signal at the second predetermined rate is provided by utilizing a selected output signal at a line labelled BYT1 of the byte counter 64 that is applied to an inverter 116 via resistor 118 and capacitor 120 providing a noise filter to the input of inverter 116. The output of inverter 116 is connected to a capacitor 122 that is connected in series with a resistor 124 connected to the positive voltage supply +V for providing a selected pulse width for a second input to NAND gate 98. The selected binary coded (BYT1) output of counter 64 provides, for example, a resulting active HIGH output corresponding to a divide by 4 of the data request (DRQP) clock input signal to the counter 64.

The refresh clock (RFK) signal output of NAND gate 98 is applied to a clock CK input of a refresh counter 126. A 12-bit binary counter integrated circuit device type MC14040B may be utilized for the refresh counter 126. Output stages 1-8 of counter 126 are applied to a refresh address driver 128. Driver 128 may be implemented with an octal buffer/line driver integrated circuit device 74HC244 providing 3-state outputs and accepting an active LOW enable E input. The refresh address driver 128 provides address bits A0:A7 to the memory 12 via corresponding address resistors 129. The output stages 10–12 of the counter 126 are applied to three weighted inputs of a bank multiplexer 130, such as quad 2-input multiplexer integrated circuit device type 74HC157. Three selected outputs such as Q5, Q6 and Q7 of the track register 58 are applied to the other three inputs of the multiplexer 130. Three multiplexer outputs are applied to the binary weighted inputs of a row address strobe RAS decoder 132, a column address strobe CAS decoder 134 and the WE decoder 94. A refresh enable signal at line RFEN (FIG. 2A) that is later described is applied to a select input of the multiplexer 130 for selecting the data inputs from the refresh counter 126 or the track register 58. The refresh enable (RFEN) signal is applied to the enable E input of refresh address driver 128. Decoders 132 and 134 may be implemented with the identical integrated circuit as employed for the decoders 26 and 94 and likewise are enabled with an active LOW enable input signal applied thereto.

An output of a NOR gate 136 at line RASD is applied to the active LOW enable input of the RAS decoder 132. The refresh clock (RFK) output of NAND gate 98 is coupled to a first input of NOR gate 136 via a time delay circuit including a parallel connected resistor 138 and a diode 140, with a capacitor 142 connected between the input of NOR gate 136 and ground potential. An output of NOR gate 144 at line CASD is applied to an active LOW enable input of the CAS decoder 134. An input of NOR gate 144 is similarly connected to the output of NAND gate 98 via a resistor 146, diode 148 and capacitor 150. Likewise, a NOR gate 152 providing an output signal at line RFEN is connected to the output of NAND gate 98 via resistor 154, a diode 156 and capacitor 158. The Q output of F/F 32 at line LOCK is applied to the second input of NOR gate 152. The output at line RFEN of NOR gate 152 is applied to an inverter 160 to provide an address enable control signal at line ADEN. The output of NAND gate 28 at line DRQP is applied to an inverter 162 via a similarly arranged time delay circuit including a resistor 164, diode 166 and capacitor 168. The output signal at line R/C of the inverter 162 is applied to a first input of a NOR gate 170 via a similar time delay configuration of a resistor 171, a diode 172 and a capacitor 174. The Q output of F/F 32 at line LOCK is applied to a second input of NOR gate 170. The output of NOR gate 170 is applied to the second input of NOR gate 144. A series-connected resistor 176 and a diode 178 are connected at their junction to a second input of the NOR gate 136 and are connected between the output of NAND gate 28 (line DRQP) and the Q output of F/F 32.

When the memory 12 is isolated from the microprocessor system 14 by the HIGH Q output of F/F 32, the resulting output (RFEN) of NOR gate 152 is LOW providing a HIGH output (ADEN) of inverter 160. This LOW (RFEN) output of NOR gate 152 enables the refresh address driver 128 so that address bits A0:A7 from the refresh counter 126 are applied to the memory 12 via corresponding address resistors 129. This LOW (RFEN) output of NOR gate 152 selects the input bits from refresh counter 126 as the multiplexer outputs applied to the RAS decoder 132, CAS decoder 134 and WE docoder 94 by the bank multiplexer 130.

With the HIGH Q output of F/F 32, a resulting LOW output of NOR gate 170 is applied to one input of NOR gate 144. Each HIGH refresh clock (RFK) signal provides a time-delayed LOW (CASD) output of the NOR gate 144 with the resistor 146 and capacitor 150 determining the sufficient time delay. The refresh clock signal is now provided at the first predetermined rate by the oscillator 96. This LOW (CASD) output of the NOR gate 144 results in the LOW column address strobe output of CAS decoder 134 at the line CAS.

The LOW Q output of F/F 32 and a LOW output of NAND gate 28 provide a LOW input to the NOR gate 136 results in a time delayed LOW (RASD) output of NOR gate 136 responsive to each HIGH refresh clock (RFK) input with the resistor 138 and capacitor 142 determining a smaller time delay so that the resulting active LOW row address strobe RAS output of decoder 132 is provided before the column address strobe CAS signal output of decoder 134.

When the memory 12 is coupled to microprocessor system 14 by the LOW Q output of F/F 32, the data request (DRQP) signal output of NAND gate 28 goes HIGH for each of the read data (RDTP) signal and write data (WDTP) signal outputs of decoder 26 providing corresponding time-delayed LOW (R/C) signal output of inverter 162. This (R/C) signal output of inverter 162 results in a corresponding time-delayed HIGH output of NOR gate 170, thereby providing a time-delayed LOW (CASD) output of NOR gate 144 responsive to each HIGH refresh clock (RFK) output and each HIGH data request (DRQP) output. The refresh clock signal is now provided at the second predetermined rate by the (BYT1) output of the counter 64.

The HIGH Q output of F/F 32 and the data request (DRQP) signal output of NAND gate 28, result in a time-delayed LOW (RASD) output of NOR gate 136 responsive to each HIGH refresh clock (RFK) output and each HIGH data request (DRQP) output.

The LOW Q output of F/F 32 provides a resulting time-delayed LOW (RFEN) output of the NOR gate 144 with each HIGH refresh clock (RFK) signal. As described for an idle memory 12, this resulting LOW (RFEN) output results in address bits A0:A7 from the refresh counter 126 applied to the memory 12 with the refresh counter bits output by the bank multiplexer 130. This output provides a resulting time-delayed HIGH (ADEN) output of the inverter 160 with each HIGH refresh clock (RFK) signal.

This (ADEN) signal output of inverter 160 is applied to an active LOW enable E input of a first and second address multiplexer 180 and 182 of the addressing circuitry 24. Selected outputs, such as outputs B0–B6 of the byte counter 64 are applied to the address multiplexer 180 for providing output address bits A0:A3 when enabled to the memory 12 via corresponding address resistors 129. A third address multiplexer 184 receives selected outputs, such as Q1 and Q2, of the track store register 58 for providing address bit A8 to the memory 12. A selected output, such as Q0 of an eight-bit sector store register 186 is applied to the address multiplexer 180. A selected output such as Q0 of the track store register 58 and the remaining outputs Q1–Q7 of the sector store register 186 are applied to the address multiplexer 182. Address multiplexers 180 and 182 can be implemented with identical integrated circuit quad 2-input multiplexer with 3-state outputs such as device type 74LS257. The sector store eight-bit register 186 may be implemented with the identical integrated circuit type as used for the track store register 58. Sector store register 186 is clocked by the set sector (SECP) output of the decoder 26 to provide data outputs corresponding to the data signals D0-D7 from the microprocessor system 14.

The R/C signal output of inverter 162 is applied to a select S input of address multiplexers 180 and 182 for providing selected outputs A0:A3 and A4:A7, respectively, to the memory 12 via address resistors 129, when enabled by the resulting time delayed LOW (ADEN) signal output of inverter 160.

In summary, the disclosed memory control interface apparatus 10 enables effective and reliable use of the external memory 12 while optimizing the power requirements for the memory 12.

Although the present invention has been described in connection with details of the preferred embodiment, many alterations and modifications may be made without departing from the invention. Accordingly, it is intended that all such alterations and modifications be considered within the spirit and scope of the invention as defined in the appended claims.

What is claimed and desired to be secured by Letters Patent of the United States is:

1. A memory control interface apparatus for connecting an external memory device with a microprocessor system comprising:
    means coupled to said microprocessor system for identifying a predetermined number of data request signals, said data request signals corresponding to data transfers between said microprocessor based system and said external memory device;
    first refreshing means coupled to said external memory and coupled to said data request signal identifying means for refreshing said external memory device at a first predetermined rate responsive to said identified number of data request signals;
    means coupled to said data request identifying means for generating a predetermined time interval signal responsive to each of said data request signals;
    second timing means coupled to said time interval generating means responsive to the absence of said time intervals for producing a time out signal; and
    second refreshing means coupled to said second timing means and coupled to said external memory device responsive to said time out signal for periodically refreshing said external memory device at a second predetermined rate; and wherein said second predetermined refreshing rate is less than said first predetermined refreshing rate.

2. A memory control interface apparatus as recited in claim 1 wherein said second refreshing means include oscillator means for generating a refreshing clock signal at second predetermined rate.

3. A memory control interface apparatus as recited in claim 2 further including counter means responsive to said refreshing clock signal for generating addressing signals and decoder means responsive to said refreshing clock signal for generating timing strobe signals.

* * * * *